US008300728B1

(12) United States Patent
Hoffmann et al.

(10) Patent No.: US 8,300,728 B1
(45) Date of Patent: Oct. 30, 2012

(54) COMPLEX ENVELOPE ELIMINATION AND RESTORATION TRANSMITTER

(75) Inventors: Theodore J. Hoffmann, Hiawatha, IA (US); David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 819 days.

(21) Appl. No.: 12/284,726

(22) Filed: Sep. 24, 2008

(51) Int. Cl.
*H03C 3/00* (2006.01)

(52) U.S. Cl. ........ 375/302; 375/324; 375/300; 375/297; 375/320; 330/124 R; 330/136; 330/253; 330/10; 455/323; 455/108; 455/149

(58) Field of Classification Search .................. 375/324, 375/302, 300, 297, 320; 330/124, 10, 124 R, 330/136, 253; 455/149, 108, 323
See application file for complete search history.

(56) References Cited

U.S. PATENT DOCUMENTS

| | | | | |
|---|---|---|---|---|
| 6,242,975 | B1 * | 6/2001 | Eidson et al. | 330/124 R |
| 6,744,309 | B1 * | 6/2004 | Petrov et al. | 329/347 |
| 6,998,914 | B2 * | 2/2006 | Robinson | 330/124 R |
| 7,276,966 | B1 * | 10/2007 | Tham et al. | 330/136 |
| 7,792,213 | B1 * | 9/2010 | Lee | 375/297 |
| 7,852,149 | B1 * | 12/2010 | Wagner | 330/10 |
| 2004/0043735 | A1 * | 3/2004 | Grosspietsch et al. | 455/149 |
| 2006/0035617 | A1 * | 2/2006 | Kim | 455/323 |
| 2008/0057881 | A1 * | 3/2008 | Dwyer | 455/108 |
| 2009/0060089 | A1 * | 3/2009 | Matsuura et al. | 375/300 |

* cited by examiner

*Primary Examiner* — Eva Puente
(74) *Attorney, Agent, or Firm* — Donna P. Suchy; Daniel M. Barbieri

(57) ABSTRACT

The invention is a method of transmitting a radio signal using a complex envelope elimination and restoration technique. The method includes receiving a radio frequency (RF) signal. Further, the method includes separating the RF signal into an in-phase baseband signal (I) and a quadrature baseband signal (Q). Still further, the method includes decomposing the (I) signal into a in-phase magnitude component and a in-phase phase component while decomposing the Q signal into a quadrature magnitude component and a quadrature phase component. Alternatively, the source signal could be digital baseband information. Digital signal processing could generate the phase and magnitude reference signals for the system.

16 Claims, 2 Drawing Sheets

COMPLEX ENVELOPE ELIMINATION AND RESTORATION TRANSMITTER

FIELD OF THE INVENTION

The present invention relates generally to transmitters. More specifically, the present invention relates to envelope elimination and restoration transmitters (EE&R).

BACKGROUND OF THE INVENTION

Radio Frequency (RF) transmitters used for wireless communication require high linearity to preserve modulation accuracy and to limit spectral regrowth. Linear amplifiers are capable of electrical efficiency greater than fifty percent when operated at saturation. However, they are generally not operated at an optimal level of efficiency due to the need to provide high linearity. Time varying envelopes present an additional problem. The current industry approach for linear transmission is to back off from the compression point of the amplifier achieving linearity at the expense of efficiency.

A number of alternative architectures have been introduced to improve transmitter efficiency. However, each approach has inherent limitations that have kept them from being widely adopted and implemented except in niche applications. The current industry approach for linear transmission is to back off from the compression point of the amplifier achieving linearity at the expense of efficiency.

Consequently, a need exists for a high efficiency transmitter.

SUMMARY OF THE INVENTION

Accordingly, the various embodiments of the present invention are directed to a complex envelope elimination and restoration (EE&R) transmitter.

According to a first embodiment, a method for improving transmitter efficiency is disclosed. A method for improving transmitter efficiency includes: the step of receiving a digital baseband input signal, the step of separating the input signal into an in-phase baseband signal and a quadrature baseband signal; the step of decomposing the in-phase baseband signal into a in-phase magnitude component and a in-phase phase component; and the step of decomposing the quadrature baseband signal into a quadrature magnitude component and a quadrature phase component.

In a further embodiment of the present invention, a device for improving transmitter efficiency is disclosed. A device for improving transmitter efficiency including: a radio frequency (RF) source/separator including an input port and at least two output ports configured for receiving a signal input and separating the signal input into an in-phase baseband signal and a quadrature baseband signal; a first limiter, the first limiter configured for receiving the in-phase baseband signal and eliminating the envelope of the in-phase baseband signal and generating a in-phase component; a second limiter, the second limiter configured for receiving the quadrature baseband signal and eliminating the envelope of the quadrature baseband signal and generating a quadrature component; a first envelope detector, the first envelope detector configured for extracting the magnitude information of the in-phase baseband signal and generating a first magnitude phase; and a second envelope detector, the second envelope detector configured for extracting the magnitude information of the quadrature baseband signal and generating a second magnitude phase.

In another embodiment of the present invention a system for improving transmitter efficiency is disclosed. A system for improving transmitter efficiency including: a signal source; a radio frequency (RF) separator comprising a input port and at least two output ports configured for receiving a signal input from the signal source and separating the signal input into an in-phase baseband signal and a quadrature baseband signal; a first limiter, the first limiter configured for receiving the in-phase baseband signal and eliminating the envelope of the in-phase baseband signal and generating a in-phase component; a second limiter, the second limiter configured for receiving the quadrature baseband signal and eliminating the envelope of the quadrature baseband signal and generating a quadrature component; a first envelope detector, the first envelope detector configured for extracting the magnitude information of the in-phase baseband signal and generating a first magnitude phase; and a second envelope detector, the second envelope detector configured for extracting the magnitude information of the quadrature baseband signal and generating a second magnitude phase.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to presently preferred embodiments of the invention, examples of which are illustrated in the accompanying drawings.

Efficient radio-frequency (RF) power amplifiers (PAs) are highly desirable in battery-operated systems such as cellular telephones. PAs typically dominate the power consumption of these portable systems. RF PAs are most efficient when operating as compressed, nonlinear amplifiers. However, these nonlinear PAs can only amplify constant-envelope RF signals without introducing significant distortion. Amplification on non-constant envelope RF signals requires linear PAs, which are inherently less power efficient.

The traditional approach to linear RF power amplification is to back-off from the compression point of the amplifier achieving linearity at the expense of efficiency. This invention discloses a complex envelope elimination and restoration transmitter according to an exemplary embodiment that achieves linearity without sacrificing efficiency.

Figure 1:
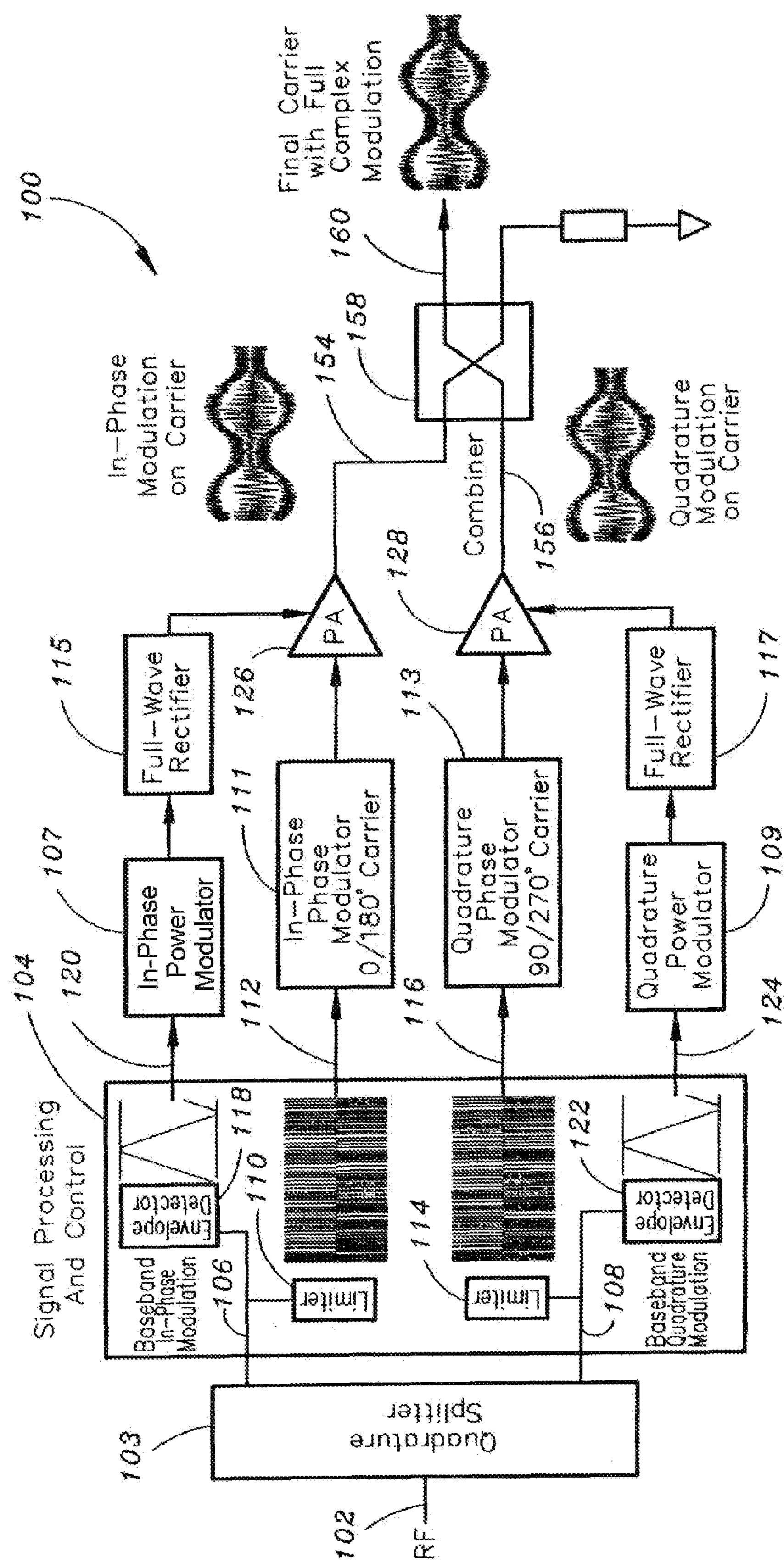
FIG. 1 illustrates a functional block diagram of a complex envelope elimination and restoration system according to an exemplary embodiment of the present invention.
Figure 2:
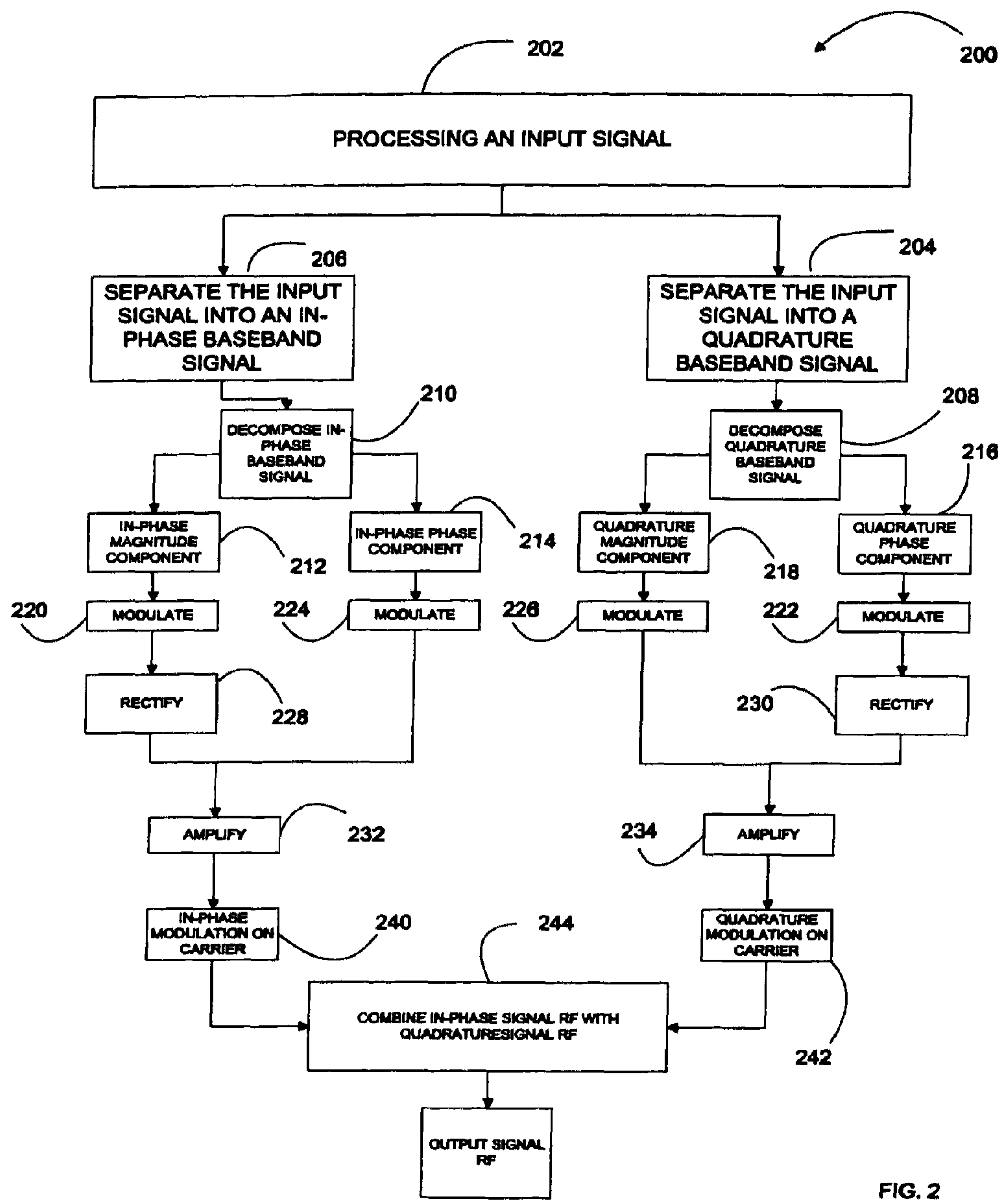
FIG. 2 illustrates a methodology for transmitter efficiency according to an exemplary embodiment of the present invention.

Referring generally to FIGS. 1-2, a complex envelope elimination and restoration system according to an exemplary embodiment of the present invention is shown. A system 100 for improving transmitter efficiency may include a signal processor 104. In a current embodiment of the present invention the signal processor 104 may be configured for receiving the signal input 102 and separating/processing the signal input 102 to form/output an in-phase signal 106 and a quadrature signal 108 with a quadrature splitter 103.

In a further embodiment of the present invention the in-phase signal 106 may be referenced at 0 degrees and the quadrature signal 108 may be offset by 90 degrees. The signal processor 104 may generate and synchronize signals required for the complex envelope elimination and restoration system 100. Signal processing may be accomplished in the digital or analog domain or a combination of digital and analog processing.

For instance, the signal processor 104 may be a modified EER signal processor. The signal processor 104 may include an input port for receiving a signal 102. Further, the signal processor 104 may include a first limiter 110. The first limiter 110 may be configured for receiving the in-phase baseband signal 106 and eliminating the envelope of the in-phase baseband signal 106 while generating an in-phase component 112. Additionally, the signal processor 104 may include a second limiter 114. The second limiter 114 may be configured for receiving the quadrature baseband signal and eliminating the envelope of the quadrature baseband signal 108 while generating a quadrature component 116. Still further, the signal processor 104 may include may include a first envelope detector 118 and a second envelope detector 122. An envelope detector may be an electronic circuit that receives a signal as input and provides an output which is the "envelope" of the original signal. For example, the first envelope detector 118 may receive the in-phase baseband signal 106 and provide the envelope of the in-phase baseband signal as a first magnitude 120 and the second envelope detector 122 may receive the quadrature baseband signal 108 and provide the envelope of the quadrature baseband signal as a second magnitude 124.

In a current embodiment of the present invention, the system 100 may include a first power modulator 107 and a second power modulator 109. The first power modulator 107 is an In-Phase power modulator 107 configured to generate a signal capable of being a bipolar signal (positive and negative voltages) at relatively large voltages and currents that track the in-phase baseband signal. The In-Phase power modulator 107 provides an isolated (non ground-referenced) output. The second power modulator 109 is a quadrature power modulator 109. The quadrature power modulator 109 is configured to generate a signal capable of being a bipolar signal (positive and negative voltages) at relatively large voltages and currents that track the quadrature baseband signal. The quadrature power modulator 109 provides an isolated (non ground-referenced) output.

In a further embodiment of the present invention, the system 100 may include a first phase modulator 111 and a second phase modulator 113. The first phase modulator 111 and the second phase modulator 113 are configured to generate a constant envelope signal at the desired carrier frequency. The first phase modulator 111 and the second phase modulator 113 are capable of 180 degree inversion when the respective baseband signal crosses below zero volts. For example, systems with a saturated linear power amplifier continuous phase adjustment may be used to compensate for AM-PM distortion in the amplifier. The first phase modulator 111 may be configured to receive an in-phase signal and the second phase modulator 113 may be configured to receive a quadrature in-phase signal. The carrier of the in-phase phase modulator 111 and the quadrature phase modulator 113 are offset 90 degrees.

In yet a further embodiment of the present invention, the system 100 may include a first full-wave rectifier 115 and a second full-wave rectifier 117. The first full wave rectifier 115 is configured to convert the output of the in-phase power modulator 107 to a purely positive voltage (absolute value of power modulator output). The second full wave rectifier 117 is configured to convert the output of the quadrature power modulator 109 to a purely positive voltage. In an alternative embodiment, the conversion of the output of the power modulator to a purely positive voltage may be performed using a MOSFET switching bridge.

In an additional embodiment of the present invention, the system 100 may include a first power amplifier 126. The first power amplifier 126 may be configured to receive/amplify the in-phase magnitude component 120 and the first in-phase component 112. For example, the first magnitude phase 120 and the in-phase component 112 may be amplified as illustrated in FIG. 1. to generate a reapplied amplified RF signal. Further, the quadrature magnitude component 124 and the quadrature component 116 are likewise amplified via a second power amplifier 128. Power amplification as illustrated in FIG. 1 may be implemented using high speed RF switching transistors.

In a further embodiment of the present invention, the system 100 may include a combiner 158. The combiner 158 may be configured for receiving the in-phase RF output signal 154 via the first input port. The combiner 158 may be further configured for receiving the quadrature RF output signal 156. The combiner 158 may be further configured for combining the in-phase RF output signal 154 with the quadrature RF output signal 156 and generating a final carrier signal 160. The final carrier signal 160 may be a carrier signal with full complex modulation.

Referring to FIG. 2, a methodology for transmitter efficiency according to an exemplary embodiment of the present invention is shown. The methodology 200 includes the step of receiving an input signal 202. For example, the input signal may be a radio frequency (RF) signal or digital baseband information.

In a further embodiment of the present invention, method 200 includes the step of separating the input signal into an in-phase baseband signal (I) 206 and a quadrature baseband signal (Q) 204.

Further, method 200 includes the step of decomposing the (I) signal 210 into an in-phase magnitude component 212 and an in-phase phase component 214. Likewise, method 200 includes the step of decomposing the (Q) signal 208 into a quadrature phase component 216 and a quadrature magnitude component 218.

In a further embodiment of the present invention, method 200 includes the step of modulating the in-phase magnitude component 220. For example, the in-phase magnitude component is modulated via an in-phase power modulator 107. Additionally, the quadrature phase component is modulated 216 via a quadrature power modulator 109.

In yet another embodiment of the present invention, method 200 includes the step of modulating the in-phase phase component 224 and modulating the quadrature components 226. For example, the in-phase phase component may be modulated via an in-phase modulator 111. Likewise, the quadrature phase component may be modulated via a quadrature phase modulator 113.

In a further embodiment of the present invention, method 200 includes the step of rectifying 228 the in-phase magnitude component of the in-phase baseband signal 106 following power modulation.

In a further embodiment of the present invention, method 200 includes the step of rectifying 230 the quadrature magnitude component 230 of the quadrature baseband signal 108 following power modulation.

In yet another embodiment of the present invention, method 200 includes the step of amplifying 232 the in-phase magnitude component and the in-phase phase component. Additionally, method 200 includes the step of amplifying 234 the quadrature magnitude component and the quadrature phase component.

In a further embodiment of the present invention, method 200 includes combining 244 the in-phase modulation on carrier 158 with the quadrature modulation on carrier 156 via a combiner.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages are to be understood by the foregoing description, and it is apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:

1. A method, comprising:

receiving an input signal, the input signal being a radio frequency (RF) signal or digital baseband information;

separating the input signal into an in-phase (I) baseband signal and a quadrature (Q) baseband signal;

decompose the I signal into an in-phase magnitude component and an in-phase phase component;

decompose the Q signal into a quadrature magnitude component and a quadrature phase component;

modulating the in-phase magnitude component and the in-phase phase component of the in-phase baseband signal;

modulating the quadrature magnitude component and the quadrature phase component of the quadrature baseband signal;

rectifying the in-phase magnitude component of the in-phase baseband signal;

rectifying the quadrature magnitude component of the quadrature baseband signal; and amplifying the in-phase magnitude component and the first in-phase phase component to a first power amplifier, wherein the in-phase magnitude component and the first in-phase phase component are composed as an in-phase modulation on carrier, wherein said modulating is operated directly on the in-phase magnitude component of the decomposed in-phase signal, the in-phase phase component of the decomposed in-phase signal, the quadrature magnitude component of the decomposed quadrature signal and the quadrature phase component of the decomposed quadrature signal.

2. The method as claimed in claim 1, further comprises:

amplifying the quadrature magnitude component and the quadrature phase component to a second power amplifier, wherein the magnitude component and the quadrature phase component are composed as a quadrature modulation on carrier.

3. The method as claimed in claim 1, further comprises:

combining the in-phase signal and the quadrature signal via a combiner.

4. The method as claimed in claim 1, wherein the in-phase baseband signal is referenced at 0 degrees.

5. The method as claimed in claim 1, wherein the quadrature baseband signal is referenced at a 90 degree offset.

6. A device, comprising:

a signal processor configured for generating and synchronizing a RF signal or digital baseband information input into an in-phase baseband signal and a quadrature baseband signal;

a first limiter, the first limiter configured for receiving the in-phase baseband signal and eliminating the envelope of the in-phase baseband signal and generating an in-phase phase component;

a second limiter, the second limiter configured for receiving the quadrature baseband signal and eliminating the envelope of the quadrature baseband signal and generating a quadrature phase component;

a first envelope detector, the first envelope detector configured for extracting the magnitude component of the in-phase baseband signal and generating a first magnitude phase;

a second envelope detector, the second envelope detector configured for extracting the magnitude component of the quadrature baseband signal and generating a second magnitude phase;

a first power modulator, the first power modulator configured for receiving the in-phase magnitude component and generating a bipolar signal capable of positive and negative voltages;

a second power modulator, the second power modulator configured for receiving the quadrature magnitude component and generating a bipolar signal capable of positive and negative voltages; and a first power amplifier, the first power amplifier configured for receiving the in-phase magnitude component and the in-phase phase component and generating a in-phase modulation on carrier, wherein the first and second power modulators are operated directly on the in-phase baseband signal and the quadrature baseband signal.

7. The device as claimed in claim 6, further comprises:

a first modulator, the first modulator configured for receiving the in-phase phase component and generating a constant envelope signal at a desired carrier frequency.

8. The device as claimed in claim 7, further comprises:

a second modulator, the second modulator configured for receiving the quadrature phase component and generating a constant envelope signal at a desired carrier frequency.

9. The device as claimed in claim 6, further comprises:

a first rectifier, the first rectifier configured for receiving the modulated in-phase magnitude component and rectifying the signal.

10. The device as claimed in claim 9, further comprises:

a second rectifier, the second rectifier configured for receiving the modulated quadrature magnitude component and rectifying the signal.

11. The device as claimed in claim 6, further comprises:

a second power amplifier, the second power amplifier configured for receiving the quadrature magnitude component and the quadrature phase component and generating a quadrature modulation on carrier.

12. The device as claimed in claim 6, further comprises:

a combiner, the combiner configured to receive the in-phase modulation on carrier output signal and the quadrature modulation on carrier, wherein in-phase modulation on carrier is combined with the quadrature modulation on carrier to generate a final carrier with full complex modulation.

13. A system for improving transmitter efficiency, comprising:

a signal source;

a signal processor configured for generating and synchronizing a RF signal input into an in-phase baseband signal and a quadrature baseband signal;

a first limiter, the first limiter configured for receiving the in-phase baseband signal and eliminating the envelope of the in-phase baseband signal and generating an in-phase component;

a second limiter, the second limiter configured for receiving the quadrature baseband signal and eliminating the envelope of the quadrature baseband signal and generating a quadrature component;

a first envelope detector, the first envelope detector configured for extracting the magnitude component of the in-phase baseband signal and generating a first magnitude phase;

a second envelope detector, the second envelope detector configured for extracting the magnitude component of the quadrature baseband signal and generating a second magnitude phase;

a first power modulator, the first power modulator configured for receiving the in-phase magnitude component and generating a bipolar signal capable of positive and negative voltages; and a second power modulator, the second power modulator configured for receiving the quadrature magnitude component and generating a bipolar signal capable of positive and negative voltages; and a first power amplifier, the first power amplifier configured for amplifying the in-phase magnitude component and the in-phase component, wherein the first and second power modulators are operated directly on the in-phase baseband signal and the quadrature baseband signal.

14. The system as claimed in claim 13, further comprises:

a first rectifier, the first rectifier configured for receiving the modulated in-phase magnitude component and rectifying the signal.

15. The system as claimed in claim 14, further comprises:

a second rectifier, the second rectifier configured for receiving the modulated quadrature magnitude component and rectifying the signal.

16. The system as claimed in claim 13, further comprises:

a second power amplifier, the second amplifier amplifying configured for amplifying the quadrature magnitude component and the quadrature component.

* * * * *